(12) United States Patent
Kim et al.

(10) Patent No.: US 6,253,346 B1
(45) Date of Patent: Jun. 26, 2001

(54) DATA TRANSMISSION CIRCUIT HAVING CYCLIC REDUNDANCY CHECK CIRCUIT AND DATA RATE CONTROL CIRCUIT

(75) Inventors: Si Joong Kim; Jae Dong Kim; Jong Seog Koh, all of Taejeon (KR)

(73) Assignee: Korea Telecommunication Authority, Kyunggi-do (KR)

( * ) Notice: Subject to any disclaimer, the term of this patent is extended or adjusted under 35 U.S.C. 154(b) by 0 days.

(21) Appl. No.: 09/203,191

(22) Filed: Nov. 30, 1998

(30) Foreign Application Priority Data

Nov. 29, 1997 (KR) ................................................ 97-64871
Dec. 3, 1997 (KR) ................................................ 97-65672

(51) Int. Cl.[7] ............................................ G06F 11/10
(52) U.S. Cl. ................................ 714/758; 375/225
(58) Field of Search ........................... 714/821, 758; 375/225; 345/26

(56) References Cited

U.S. PATENT DOCUMENTS

| 3,885,098 | * | 5/1975 | Dowling | ............... | 375/328 |
| 5,361,266 | * | 11/1994 | Kodama et al. | ............... | 714/758 |
| 5,640,172 | * | 6/1997 | Kim | ............... | 345/26 |
| 5,923,151 | * | 7/1999 | Satoh | ............... | 322/28 |

* cited by examiner

Primary Examiner—Phung M. Chung
(74) Attorney, Agent, or Firm—Merchant & Gould P.C.

(57) ABSTRACT

A data transmission circuit includes a cyclic check (CRC) circuit which improves operation speed of the overall system by checking errors for safe data transmission and a data rate control circuit of which the rate control portion required for data interface includes two simple counter logics to control the data rate during data interface.

6 Claims, 4 Drawing Sheets

DATA TRANSMISSION CIRCUIT HAVING CYCLIC REDUNDANCY CHECK CIRCUIT AND DATA RATE CONTROL CIRCUIT

BACKGROUND OF THE INVENTION

1. Field of the Invention

The present invention relates to a data transmission circuit having a cyclic redundancy check (CRC) circuit which improves operation speed of the overall system by checking errors for safe data transmission and a data the rate control circuit of which rate control portion required for data interface has two simple counter logics to control the data rate during data interface.

2. Discussion of the Related Art

Generally, safe data transmission should be performed during data transmission. For safe data transmission, it is essential to check errors and restore errors. As a method for checking errors of transmission data, a simple and logic CRC method is used. This CRC method serially detects serial transmission data of bit unit using multistage delay and XOR gate. Various equations such as sixteenth equation and thirty-second equation and the like can be expressed depending on the amount of data analysis.

The operation of such a CRC processing circuit will be described in detail with reference to FIG. 1.

FIG. 1 shows a typical 32-bit CRC circuit. The CRC circuit performs operation of bit unit and includes 14 adders 1 and 32 delay elements 2.

The input of the CRC circuit is added to the output $z(31)$ and the result thereof is inputted to $z(0)$ and another adder. The input of the other adder is the output of the delay element 2 $z(i)$ and this output is connected to the input of $z(I+1)$. The polynomial for this circuit can be expressed as equation 1.

$$x32+x26+x23+x22+x16+x12+x11+x10+x8+x7+x5+x4+x2+x+1 \qquad \text{<Equation 1>}$$

If 1 byte data is inputted to the CRC circuit, each byte data is shifted by 1 bit per one clock and then is inputted to the CRC circuit. In other words, the most significant bit is inputted and then the least significant bit is serially inputted. For example, when 1 byte data is 0×01, values 0 of seven are inputted and value 1 is finally inputted.

Prior to the operation of the CRC circuit, all of the delay elements 2 $z(i)$ are defined as an initial value 1 and then byte data is inputted to the CRC circuit after initiation.

The 32-bit CRC encoder and decoder have the same fundamental operation as each other. The encoder transfers input data plus 32-bit CRC data, that is, 32 delay elements $z(i)$. In order to detect whether or not error has occurred during data transmission, the decoder checks whether or not the values of the 32 delay elements $z(i)$ are all 0 when all the data including CRC data are processed in the CRC circuit.

However, in the CRC method, since the data are processed in series, operation speed of the overall system is reduced. In other words, all the data are processed in parallel in the systems except for the CRC module while the data are processed in series in the CRC circuit. This causes bottlenecks in the operation of the overall system.

Meanwhile, data rate control circuit technology is applicable to the system that require coordination which prevents data error, such as digital TV(DTV), high definition TV (HDTV), video on demand (VOD) system, video conference codec system and optical band ISDN terminal codec system. In this control technology, data rate in data transmission network, equipment or parts are inevitably changed. In addition, since MPEG-2 codec system data for ATM communication maintains variability, data rate in data transmission to network is inevitably changed.

For data interface in various applications to video, audio and multi chips, it is necessary to control data rate. At this time, for data rate coordination, additional parts and circuits such as phase locked loop (PLL) and other clock sources are required.

SUMMARY OF THE INVENTION

Accordingly, the present invention is directed to a data transmission circuit that substantially obviates one or more of the problems due to limitations and disadvantages of the related art.

An object of the present invention is to provide a data transmission circuit having a cyclic redundancy check (CRC) circuit which improves the operation speed of the overall system by performing CRC processing in parallel and checks errors in parallel.

Other object of the present invention is to provide a data transmission circuit having a data rate control circuit of which the rate control portion has two simple counter logics to control the data rate during data interface to simplify a data rate control circuit required for system interface.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a data transmission circuit of the present invention includes a CRC circuit which performs, in parallel, CRC processing and a data rate control circuit which controls the data rate during data interface. In the data transmission circuit of the present invention, the CRC circuit includes an operation portion for initiating a storing means which stores CRC processing results and for initiating CRC processing circuit by inputting a CRC signal, a CRC logic portion for outputting CRC processing data in response to control logic, and a latch for outputting data stored in the storing means by inputting an enable signal which is indicative of the effectiveness of the current data output from the CRC logic portion.

In another aspect, the data rate control circuit includes a K down counter for down counting the bit number of burst data, a K+A down counter for further down counting the generating position of burst data through the K down data, and an RS flip-flop for latching data request or transmission position in response to processing of the K down counter and K+A down counter.

In another aspect, the CRC circuit includes an operation portion for initiating a storing means which stores CRC processing results by inputting a reset signal and for initiating a CRC processing circuit whenever new data are processed by inputting a CRC start signal, a CRC logic portion for processing and outputting CRC processing data in response to control logic, and a latch for outputting data stored in the storing means by inputting an enable signal which is indicative of the effectiveness of the current data output from the CRC logic portion.

In another aspect, the data rate control circuit includes a K down counter for down counting the bit number of burst data, a K+A down counter for down counting generating position of burst data down counted through the K down data, and RS flip-flops for latching data request or transmission position in response to processing of the K down counter and K+A down counter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In a CRC circuit of the present invention, PTS and DTS processing circuits according to the first embodiment of the present invention will be described below.

Since all the data are processed for the unit of byte, the CRC processing circuit is processed by one clock by inputting one byte. Therefore, if one byte data is inputted, the data is processed serially by one bit.

Figure 1:
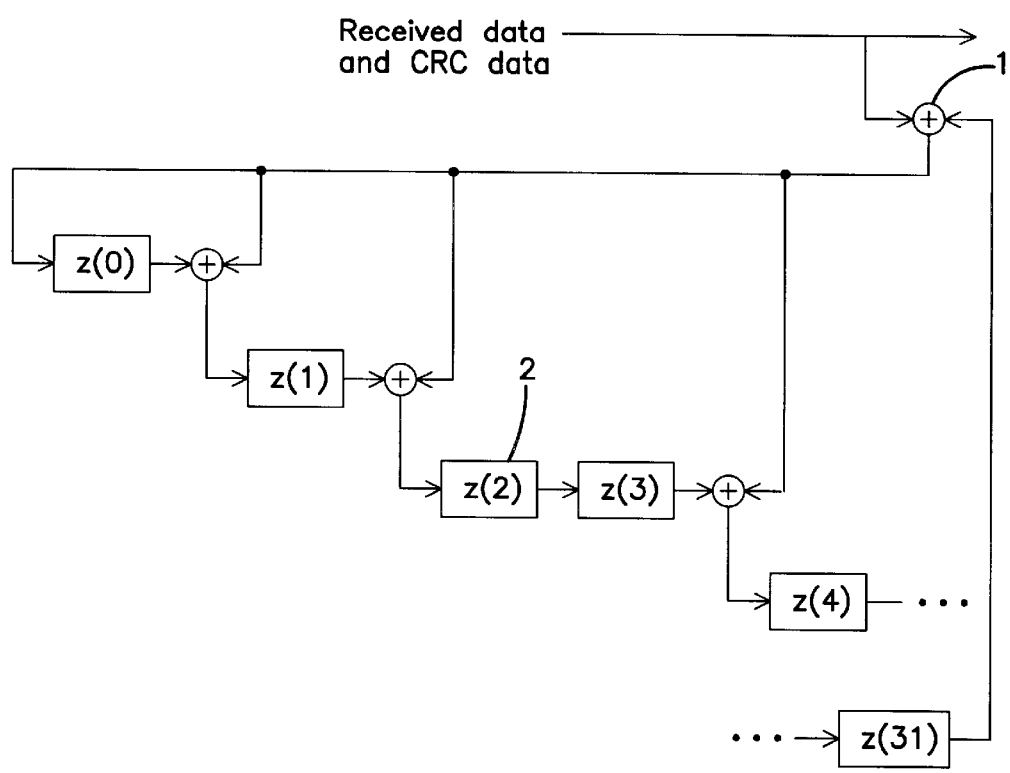
FIG. 1 shows a typical 32-bit CRC circuit.
Figure 2:
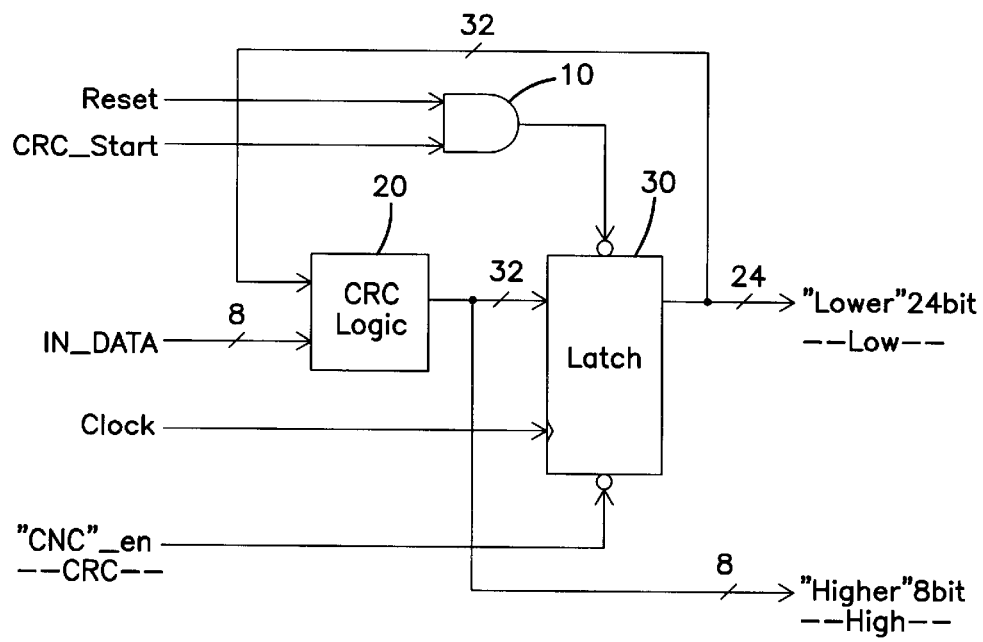
FIG. 2 shows a CRC circuit according to the first embodiment of the present invention.

A parallel CRC generating circuit of the present invention, as shown in FIG. 2, includes a NAND operation portion 10 for initiating a storing means which stores CRC processing results by inputting a reset signal and for initiating a CRC processing circuit whenever new data are processed by inputting a CRC start signal, a CRC logic portion 20 for processing and outputting data in response to control logic by inputting CRC processing data IN_DATA [7:0], and a latch 30 for outputting data stored in the storing means by inputting an enable signal CRC_en which is indicative of the effectiveness of the current data output from the CRC logic portion 20.

The CRC logic portion 20 serves as an XOR gate logic portion and divides output data into high 8bit data HCRC_DATA[31:24] and low 24bit data LCRC_DATA[23:0]. The reason why the output data is divided is that delay of one clock may occur due to the output of the flip-flop. For this reason, if the CRC processing results are inserted for the unit of byte, multiplexed results should be used.

The operation of the above CRC circuit according to the present invention will be described.

Initial input data is divided into high 8 bits and low 24 bits through a control logic of the CRC logic portion 20. The output bits, 32bits are all input to the latch 30 and, at the same time, the high 8 bits among 32 bits are outputted by other path.

The latch 30 outputs the low 24 bits among the 32 bits and at the same time feeds back the 32 bits to the CRC logic portion 20. Thus, second input data are outputted through a serial operation with the prior feedback data. Meanwhile, in the present invention, the data in the CRC logic portion 20 and the latch 30 are programmed using C-language and then programmed using hardware language VHDL to control the operation of the circuit. The operation by C-language will be described below.

First, it is assumed that initial data value output from the latch 30 is X and the current input data is D. In this state, if 1 bit data D is inputted to the CRC logic portion 20, XOR operation results of the output value X of the prior latch and the current input data D are inputted to the latch 30. Therefore, when final 8 bit data is inputted, the relation between X and D can be expressed. The same results can be obtained by inputting 8 bit data to one clock. XOR operation results of X and D are realized by hardware language. In the present invention, it is assumed that X is the output of the latch 30 and D is inputted 8 bit data.

After the CRC operation of the last bit among the 8 bits, if a transport stream data generating means (not shown) is inserted, the high 8 bits RRE_CRC32_dout are directly outputted without passing through the latch 30 in order to avoid data delay for one clock and high 24 bits are programmed to be output through the latch 30.

If the CRC operation is performed through the above steps, the results for performing parallel CRC for 1 byte can be obtained.

In a data rate control circuit according to the second embodiment of the present invention, it is recognized that it is difficult to realize real hardware (H/W) for uniformly requesting and transferring data to an external encoder and decoder in response to bit rate defined by a user.

To realize hardware, PLL circuit using exact voltage control oscillator VCXO is required. In the present invention, a rate control circuit having uniform property for receiving burst data request is designed.

First, it is assumed that the maximum clock frequency for use in the system is F and the bit rate value to be requested and transferred is B. In this case, the following equation can be expressed.

[Equation 1]

bit rate (B)=K over {K+A} X F hz Wherein, K is the bit number of burst data, K+A is burst data generating position, that is, uniform data generating position, A is data showing how far data is generated from the current generating position, F is the system maximum clock frequency, and B is bit rate value.

In the above equation 1, supposing that burst degree for one time data request is 8 bits of 1 byte unit, K is 8.

i) When bit rate is 27 Mbps, A is 0. Therefore, K is 8 and data per clock is requested.

ii) When bit rate is 6 Mbps, K is 8 and K+A is 36. Therefore, A is 28. That is, after K bit request, K bit is requested again in 28th clock.

iii) possible bit rate can be requested as above i) and ii).

However, since K is constant and data is requested in response to the value A, it is possible that all bit rate may not be satisfied. Since K and A can have a temporarily uniform value, the user can define all bit rate.

However, all bit rate is limited by the values K and A of hardware.

As the above equation states, K and K+A can be realized by two simple counters.

The operation principle by data rate control according to the present invention will be described below.

Figure 3:
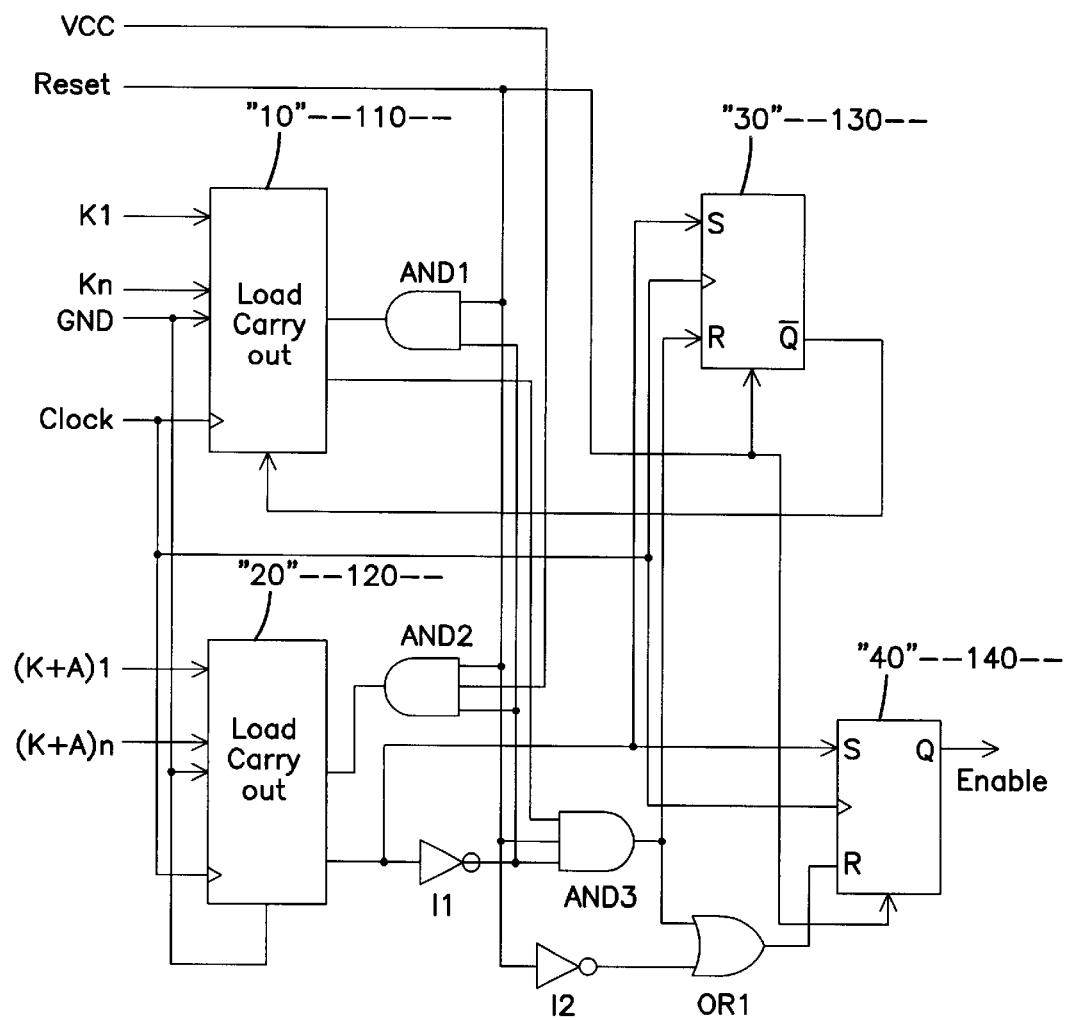
FIG. 3 shows a data rate control circuit according to the second embodiment of the present invention.

As shown in FIG. 3, in the rate control circuit, the K down counter 110 and the K+A down counter 120 are operated at low, 0 and active state.

The operation of the data rate circuit will be described below.

Figure 4:
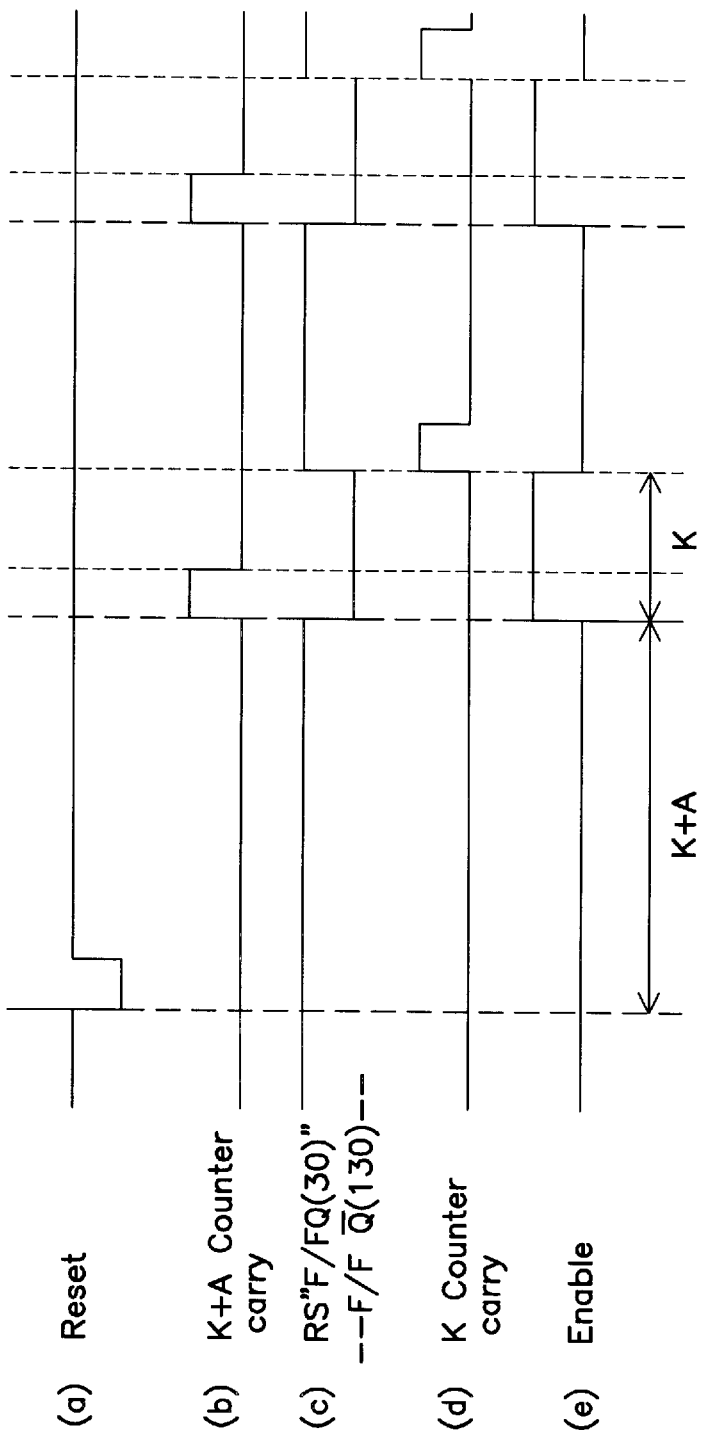
FIG 4 shows output waveforms of respective elements according to the present invention.

First, as shown in line (a) of FIG. 4, if a reset signal is applied, the K down counter 110 and the K+A down counter 120 load initial values K and K+A through AND gate AND1 and AND gate AND2.

/Q output of the RS flip-flop 130 becomes 1 and the reset signal becomes 1 by an inverter i2. Q output becomes 0 by resetting the RS flip-flop 140 through an OR gate OR1. Therefore, an enable signal which requests data reading becomes 0 and an enable signal of the K down counter 110 becomes 1 to load the initial value so that the enable signal is stopped.

When the K+A down counter 120 performs down counting to have a value 0, as shown in Line (b) of FIG. 4, the K+A down counter 120 generates a carry signal and becomes the value 0 through the inverter i1, so that the K down counter 110 and the K+A down counter 120 load the initial value through the AND gate AND1 and the AND gate AND2.

Further, the carry signal sets the RS flip-flop 130 so that /Q output becomes 0 as shown in Line (c) of FIG. 4. At this time, the K down counter 110 starts to perform down counting.

As shown in Line (e) of FIG. 4, Q output of the RS flip-flop 140 becomes 1. When the K down counter 110 becomes 0, the K down counter 110 generates the carry signal as shown in Line (d) of FIG. 4.

The carry signal becomes the carry output of the K+A down counter 120, and the inputs of the reset signal and the AND gate AND3. The AND gate AND3 outputs 1 by AND operation because the carry output of the K+A counter 120 is 1 and the reset signal is 1. Therefore, as shown in Line (c) of FIG. 4, the output value of /Q becomes 1 again by resetting the RS flip-flop 130.

As a result, the operation of the K down counter 110 is stopped as shown in Line (d) of FIG. 4.

Furthermore, since the AND gate AND3 resets the RS flip-flop 140 through the OR gate OR1, the enable signal which requests data reading becomes 0 as shown in Line (e) of FIG. 4.

As shown in output waveforms of FIG. 4, if 1 is maintained for K period to use as a data request signal to other module, proper burst data may be generated. Therefore, the K down counter 110 and the K+A down counter 120 can be used as a circuit which maintains various data request bit rate in response to initial value.

As aforementioned, since the CRC method for checking error which may be generated during data transmission is realized in parallel, the operation of the overall system can be improved. The operation speed can be synchronized to the overall system.

Also, in the present invention regarding the rate control required for data interface, two simple counter logics have been provided. A circuit required for system interface is significantly simplified and applicable to various application fields which require rate control, such as digital TV (DTV), high definition TV (HDTV), video on demand (VOD) system, video conference codec system and optical band ISDN terminal codec system.

It will be apparent to those skilled in the art that various modifications and variations can be made in the data transmission circuit according to the present invention without departing from the spirit or scope of the invention. Thus, it is intended that the present invention covers the modifications and variations of the invention provided they come within the scope of the appended claims and their equivalents.

What is claimed is:

1. A data transmission circuit comprising a CRC circuit which performs CRC processing in parallel and a data rate control circuit which controls data rate during data interface, wherein the CRC circuit includes:

an operation portion for initiating a storing means which stores CRC processing results and for initiating CRC processing circuit by inputting a CRC signal;

a CRC logic portion for outputting CRC processing data in response to control logic; and a latch for outputting data stored in the storing means by inputting an enable signal which is indicative of effectiveness of the current data output from the CRC logic portion, and the data rate control circuit includes:

a K down counter for down counting the bit number of burst data;

a K+A down counter for further down counting generating position of burst data through the K down data; and an RS flip-flop for latching data request or transmission position in response to processing of the K down counter and K+A down counter.

2. A CRC circuit comprising:

an operation portion for initiating a storing means which stores CRC processing results by inputting a reset signal and for initiating a CRC processing circuit whenever new data are processed by inputting a CRC start signal;

a CRC logic portion for processing and outputting CRC processing data in response to control logic; and a latch for outputting data stored in the storing means by inputting an enable signal which is indicative of effectiveness of the current data output from the CRC logic portion.

3. The CRC circuit as claimed in claim 2, wherein the CRC logic portion is designed by XOR gate logic and the control logic is realized to repeat the same loop for the bit number to be processed in one clock.

4. The CRC circuit as claimed in claim 2, wherein the CRC logic portion and the latch output high 8 bits and low 24 bits to prevent delay due to the use of the flip-flop.

5. A data rate control circuit comprising:

a K down counter for down counting the bit number of burst data;

a K+A down counter for down counting generating position of burst data down counting through the K down data;

an RS flip-flop, and means for coupling said K down counter, said K+A down counter, and said RS flip-flop;

wherein said RS flip-flop latches a data requesting signal in response to processing of signals from the K down counter and the K+A down counter.

6. The data rate control circuit as claimed in claim 5, wherein the K down counter and the K+A down counter, supposing that the maximum clock frequency is F and bit rate value to be requested or transferred is B, control the rate using counter initial value as follows:

bit rate (B)=K over {K+A} X F hz.

* * * * *